(12) United States Patent
Fries et al.

(10) Patent No.: US 7,194,753 B1
(45) Date of Patent: Mar. 20, 2007

(54) SYSTEM AND METHOD FOR EFFICIENTLY TUNING TO CHANNELS OF A VARIETY OF DIFFERENT BROADCAST TYPES

(75) Inventors: Robert M. Fries, Redmond, WA (US); Michael E. Pietraszak, Redmond, WA (US)

(73) Assignee: Microsoft Corporation, Redmond, WA (US)

(*) Notice: Subject to any disclaimer, the term of this patent is extended or adjusted under 35 U.S.C. 154(b) by 0 days.

(21) Appl. No.: 09/526,628

(22) Filed: Mar. 16, 2000

Related U.S. Application Data

(60) Provisional application No. 60/129,775, filed on Apr. 15, 1999.

(51) Int. Cl.
*H04N 5/455* (2006.01)
*H04N 7/16* (2006.01)

(52) U.S. Cl. .................... 725/38; 725/39; 725/40; 725/144; 348/552; 348/563; 348/569

(58) Field of Classification Search ............ 725/48–49, 725/59, 38, 39, 40, 43, 45, 104, 144; 348/731, 348/732, 473, 552, 563, 569
See application file for complete search history.

(56) References Cited

U.S. PATENT DOCUMENTS

| | | | | |
|---|---|---|---|---|
| 4,907,079 A | | 3/1990 | Turner et al. .............. 358/84 |
| 5,210,611 A | * | 5/1993 | Yee et al. .................. 348/473 |
| 5,596,373 A | * | 1/1997 | White et al. ............... 348/569 |
| 5,684,525 A | | 11/1997 | Klosterman ................ 348/12 |
| 5,828,945 A | * | 10/1998 | Klosterman ................ 455/42 |
| 5,883,677 A | * | 3/1999 | Hofmann .................... 348/584 |
| 5,982,411 A | * | 11/1999 | Eyer et al. ................. 725/49 |
| 6,002,394 A | * | 12/1999 | Schein et al. ............. 725/39 |
| 6,003,041 A | * | 12/1999 | Wugofski ................... 707/104.1 |
| 6,133,910 A | * | 10/2000 | Stinebruner ................ 725/49 |
| 6,157,411 A | * | 12/2000 | Williams et al. .......... 348/552 |
| 6,182,287 B1 | * | 1/2001 | Schneidewend et al. ..... 725/48 |
| 6,305,018 B1 | * | 10/2001 | Usui et al. .................. 725/49 |
| 6,321,382 B1 | * | 11/2001 | Wugofski ................... 725/59 |
| 6,348,932 B1 | * | 2/2002 | Nishikawa et al. ........ 345/719 |

(Continued)

FOREIGN PATENT DOCUMENTS

EP 0 849 954 A2 6/1998

OTHER PUBLICATIONS

ISO/IEC 1-3818, International organization for standardization coding of moving pictures and associated audio, Mar. 1994.*

*Primary Examiner*—Kieu-Oanh Bui
(74) *Attorney, Agent, or Firm*—Workman Nydegger

(57) ABSTRACT

A tuning system is described that is capable of receiving a number of different broadcast types such as analog or digital satellite, cable, Internet, and terrestrial airwave broadcasts. The tuning system stores service records, each service recording containing information required to tune to a particular channel. These service records are categorized within service spaces by tuner type, content, or in any other desired manner. A viewer selects (actively or by default) the service space in which the viewer desires to channel surf. The viewer then selects the desired channel within that service space. In response to this selection, the tuning system uses the information within the selected service record to identify the correct tuner, and to cause that tuner to tune to the selected channel.

37 Claims, 9 Drawing Sheets

U.S. PATENT DOCUMENTS

| | | | |
|---|---|---|---|
| 6,483,547 B1 * | 11/2002 | Eyer | 348/473 |
| 6,486,925 B1 * | 11/2002 | Ko | 348/731 |
| 6,487,720 B1 * | 11/2002 | Ohishi | 725/31 |
| 6,490,001 B1 * | 12/2002 | Shintani et al. | 348/554 |
| 6,493,876 B1 * | 12/2002 | DeFreese et al. | 725/100 |
| 6,819,711 B1 * | 11/2004 | Forde | 375/224 |
| 2003/0135856 A1 * | 7/2003 | Hancock et al. | 725/50 |

* cited by examiner

SYSTEM AND METHOD FOR EFFICIENTLY TUNING TO CHANNELS OF A VARIETY OF DIFFERENT BROADCAST TYPES

CROSS-REFERENCE TO RELATED APPLICATIONS

The present application is a non-provisional United States patent application based on a U.S. provisional patent application having a Ser. No. 60/129,775, filed Apr. 15, 1999, and entitled "Master Service Graph", which provisional application is incorporated herein by reference.

BACKGROUND OF THE INVENTION

1. The Field of the Invention

The present invention relates to electrical computers and data processing systems. Specifically, the present invention relates to a system and method for efficiently tuning to channels of a variety of different broadcast types.

2. The Prior State of the Art

Multimedia data (e.g., audio, video, and other data) is broadcast using a variety of different transmission technologies.

One of the first major broadcast technologies is radio in which audio data is transmitted over terrestrial airwaves using an analog audio signal blended with a carrier wave. The analog audio signal is blended with the carrier wave in preparation for transmission by varying the amplitude of the carrier wave as in Amplitude Modulation (AM), or by varying the frequency of the carrier wave as in Frequency Modulation (FM). The blended carrier wave is then transmitted using an antenna over "terrestrial airwaves" meaning that the transmission occurs over the air without using a conductive medium and without the aid of an earth orbiting satellite. A radio receiver (also commonly referred to as simply a "radio") includes an antenna for receiving the blended carrier wave, a tuner for extracting the analog audio signal from the carrier wave, and a speaker for converting the analog audio signal into sound.

A radio station may be licensed to transmit using a carrier wave of a specified frequency. For example, in the United States, AM radio stations may be licensed to broadcast at a specific frequency within the range of from 530 kilohertz to 1.7 megahertz. FM radio stations may broadcast at a specific frequency within the range of from 88 megahertz to 108 megahertz.

Early television technology uses similar technology as radio technology. However, video data and audio data are both transmitted over terrestrial airwaves in the form of an analog signal blended with a carrier wave. In the United States, Very High Frequency (VHF) television channels 2 to 6 are typically transmitted using a carrier wave of a specific frequency in the range of from 55 to 88 megahertz. VHF channels 7–13 use a specific frequency in the range of from 174 to 216 megahertz. Ultra High Frequency (UHF) channels 14–83 use a specific frequency in the range of from 470 to 890 megahertz. The television receiver (also commonly called a "television") receives the television signal using an antenna, extract the video and audio data from the carrier wave using a tuner, converts the video data into video images using a display, and converts the audio data into sound using a speaker.

In radio and early television technology, broadcasting occurs by transmitting signals over terrestrial airwaves as described above. However, more recently, various other broadcast mediums are used such as cable and satellite networks. In cable networks, television and Internet data are transmitted over the cable network and to a television set or computer connected to the cable network. In satellite networks, the television and Internet data are transmitted to the television or computer using an earth orbiting satellite.

Until recently, television broadcasts used analog signals only. Currently, however, digital television broadcasts are available via satellite using the Digital Video Broadcast Satellite (DVB-S) standard. It is anticipated that in the near future, digital television broadcasts will also be available using terrestrial airwaves and cable. The FCC has mandated many aspects of the Advanced Television Standards Committee (ATSC) standard for broadcasting digital television signals over terrestrial airwaves and cable.

As apparent from the above, there are numerous types of audio or video broadcast types that either now exist or will likely exist including AM radio, FM radio, analog terrestrial airwave, digital terrestrial airwave, analog cable, digital cable, analog satellite, digital satellite and so forth. Some devices may be capable of receiving several of these broadcast types. Typically, a special tuner is required for each broadcast type. Thus, in order to tune to a desired channel, the viewer chooses the broadcast type in order to select the tuner. Next, the viewer selects the channel within that broadcast type. Thus, in order to tune to the desired channel, the viewer must have some knowledge about what channels are contained within each broadcast type. Typically, however, a viewer may not have full knowledge about what channels are offered on a certain broadcast type. This might especially be the case in broadcast types that offer numerous channels.

Also, acquisition of a digital television signal is a multistep operation that can be significantly slow. For instance, once a tune request is received, the tuner first monitors the digital video stream in order to extract tuning information such as the program number or program identifier from the video stream. Once this necessary information is extracted, the tuner can finally tune to the desired channel. The initial step of extracting the necessary tuning information can take significant time. Thus, many consumers find that channel changing across digital channels can be an annoyingly slow process.

Thus, what is desired is a system and method for more efficiently tuning to a desired channel in a device that receives multiple broadcast types. Furthermore, it would be desirable if such a system and method provided a faster tune to digital channels.

SUMMARY OF THE INVENTION

A tuning system that is capable of receiving a number of different broadcast types is described. These broadcast types might be analog or digital and may be via satellite, cable, the Internet, terrestrial airwave, and so forth.

The tuning system stores "service records" in a memory accessible by the tuning system. Each service record contains the complete set of information required to tune to a particular channel. For example, for an analog channel, the tuning information in a service record might include an identification of the tuner along with an identification of the channels such as call letters, a channel number, or a frequency. For a digital channel, the complete set of tuning information could include an identification of the tuner and other information usually found within the broadcast data stream (e.g., an MPEG-2 stream) such as a program identifier (i.e., PID), and a data structure of the data stream. In MPEG-2 digital broadcast, this information might be found in the Program Map Table (PMT) or in the Program Association Table (PAT) portions of the broadcast. Storing this complete set of tuning information saves considerable time tune-to-tune in digital channel changing since it is no longer necessary to extract tuning information from a sequence of tables represented in the digital video stream.

These service records are categorized within "service spaces" in any desired manner. One possible categorization is according to tuner type. For example, all channels obtainable by a cable tuner may be included in one service space, all channels obtainable by a satellite tuner may be included in another, and so forth. Further, service spaces may be independent of tuner type and may be categorized by some other parameter such as content. For example, service spaces may be dedicated to sports, news, children's television, educational channels, and so forth, regardless of what tuner is used to obtain that channel.

The service space may physically include a copy of the service record. However, to conserve on memory, the service space contains pointers to each service record that is part of that service space.

A viewer selects the service space in which the viewer desires to channel surf. The viewer might then be presented with a graphical user interface which lists all channels corresponding to the service records within that service space. Alternatively, no graphical user interface is provided. Instead, the viewer uses a remote control or other input device to channel up or down through the available channels that are provided by the service space. Thus, if a viewer desires to view only designated "favorite" channels, the viewer selects a "favorites" service space and selects the desired one of the favorite channels. In response to this selection, the tuning system uses the information within the selected service record to identify the correct tuner, and to cause that tuner to perform a tune of the selected channel.

This tuning system allows a viewer to quickly and efficiently channel surf through a category of channels even if those channels correspond to a variety of different broadcast types or tuners. Switching between broadcast types is automatic and does not require any additional user input such as a broadcast or tuner identification. Thus, the user need not memorize the channels associated with a particular broadcast or tuner. Instead, the channels are neatly organized as desired by the user.

Furthermore, tuning information related to digital channels is also stored in the service space. In a typical digital tuning system, the tuner obtains tuning information from the digital data stream such as an MPEG-2 broadcast. Often, it takes significant time for the tuner to extract the necessary tuning information from the digital broadcast data stream. This results in noticeable and often annoying time delays in channel surfing. Once accurate and reliable tuning information for a given channel is extracted from the digital video stream, the tuning system described herein avoids time delay in digital tuning by quickly retrieving this previously extracted information from a cache memory rather that slowly re-extracting the information from the digital video stream. This information is validated and, if necessary, updated after the tune is complete. Thus, viewers of digital programming may obtain quick digital channel changes.

Additional objects and advantages of the invention will be set forth in the description which follows, and in part will be obvious from the description, or may be learned by the practice of the invention. The objects and advantages of the invention may be realized and obtained by means of the instruments and combinations particularly pointed out in the appended claims. These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF THE PREFERRED EMBODIMENTS

Figure 1:
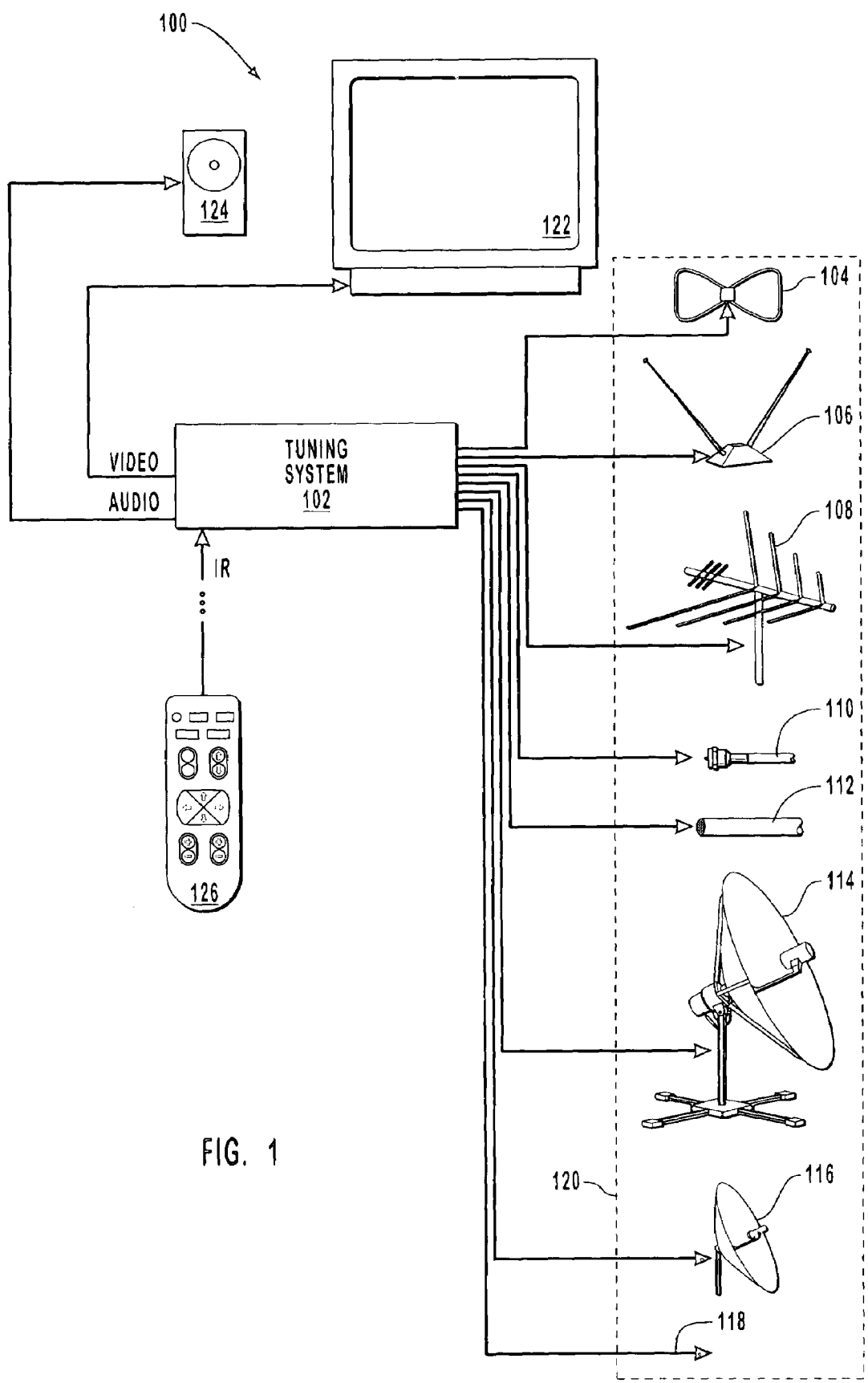
FIG. 1 schematically illustrates a suitable operating environment for the present invention.

In accordance with the present invention, a tuning system that is capable of receiving a number of different broadcast types is provided. These broadcast types might be analog or digital and may be via satellite, cable, Internet, terrestrial airwave broadcast, and so forth. The tuning system stores service records containing information required for tuning to a particular channel. These service records are categorized within service spaces in any desired manner. One possible categorization is according to tuner type. For example, all channels obtainable by a cable tuner may be included in one service space, all channels obtainable by a satellite tuner may be included in another, and so forth. Further, service spaces may be independent of tuner type and may be categorized by some other parameter such as content. For example, service spaces may be dedicated to sports, news, children's television, educational channels, and so forth, regardless of what tuner is used to obtain that channel. A viewer can select that service space and channel surf through the service space without having to specify the tuner or broadcast type used to obtain that channel.

The invention is described below by using diagrams to illustrate either the structure or processing of embodiments used to implement the system and method of the present invention. Using the diagrams in this manner to present the invention should not be construed as limiting of its scope. The embodiments of the present invention may comprise a special purpose or general purpose computer including various computer hardware, as discussed in greater detail below. The embodiments may further comprise multiple computers linked in a network environment.

Embodiments within the scope of the present invention also include computer readable media having stored thereon program code means such as executable instructions or data fields. Such computer readable media can be any available media which can be accessed by a general purpose or special purpose computer. By way of example, and not limitation, such computer readable media can comprise RAM, ROM, EEPROM, CD-ROM or other optical disk storage, magnetic disk storage or other magnetic storage devices, or any other medium which can be used to store the desired executable instructions or data fields and which can be accessed by a general purpose or special purpose computer. Such computer readable media may also comprise a smart card. Combinations of the above should also be included within the scope of computer readable media. Executable instructions comprise, for example, instructions and data which cause a general purpose computer, special purpose computer, or special purpose processing device to perform a certain function or group of functions.

Although not required, the invention will be described in the general context of computer-executable instructions, such as program modules, being executed by a personal computer. Generally, program modules include routines, programs, objects, components, data structures, etc. that perform particular tasks or implement particular abstract data types. The invention will also be described by making reference to documents or records, which generally include or are defined by encoded data structures stored in a computer-readable medium or a computer memory device. The encoded data structures of records often represent words, numbers, or other expression and generally may be generated, edited, displayed and/or stored using a computer.

In one embodiment, the invention is used in a system known as WebTV®, manufactured by WebTV Networks, Inc., of Palo Alto, Calif., which uses a conventional television screen or another display unit in combination with a networked computer for composing, sending and receiving e-mail, browsing the World Wide Web (Web), accessing other segments of the Internet, and otherwise displaying information. A WebTV® system uses standard telephone lines, Integrated Services Digital Network (ISDN) lines, cable lines associated with cable television service, or the like to connect to the Internet or other wide area networks.

FIG. 1 schematically illustrates an environment 100 that represents a suitable operating environment for the present invention. The environment 100 includes a tuning system 102 that is capable of tuning to channels of a plurality of broadcast types whether the channel includes an audio signal, a video signal, another data signal, or any combination of these signals. The tuning system 102 may be a personal computer, a set top box for a television, an integrated unit within a television, or any other device that receives signals of more than one broadcast type. In one embodiment, the tuning system 102 is a WebTV® client.

The tuning system 102 includes a means and step for receiving a plurality of different broadcast types. This means for receiving may include any device or combination of devices capable of receiving one or more broadcast types. The present invention is not limited to any particular device or combination of devices. By way of example only, the means for receiving is shown in FIG. 1 as the combination of devices enclosed by the dashed box 120.

The combination of devices may include one or more antennas for receiving channeled signals over terrestrial airwaves. For example, a radio antenna 104 receives radio signals (e.g., AM radio, FM radio, CB radio, and so forth), an analog television antenna 106 for receiving analog television signals (e.g., VHF television and UHF television), and a digital television antenna 108 received digital television signals (e.g., ATSC standard, NTSC standard, DVB standard, and so forth). It should be noted that the function of several antennas may often be combined into a single antenna as is known in the art.

The combination of devices may also include one or more cables for receiving channeled signals over a cable network. For example, an analog cable 110 receives analog signals and a digital cable 112 for receiving digital signals. It should be noted that some cables may be capable of communicating both analog and digital signals as is known in the art.

The combination of devices may also include one or more satellite dishes for receiving channeled signals from a satellite. For example, an analog satellite dish 114 receives analog signals and a digital satellite dish 116 receives digital signals. Furthermore, a single satellite dish may be able to receive both analog and digital satellite signals.

The combination of devices may also include an Internet connection 118 such as Plain Old Telephone Service (POTS), cable, satellite, Integrated Services Digital Network (ISDN), T-1, T-2, T-3, or any other type of Internet connection.

The combination of devices may also include receiver devices for receiving signals over any other medium as well. The combination of devices is coupled to the tuning system 102 so as to route received signals to the tuning system 102.

The environment 100 of FIG. 1 also includes a means for displaying viewable data (e.g., display device 122), a means for sounding audible data (e.g., speaker device 124), and a means for receiving instructions (e.g., input device 126).

The display device 122 may be any device capable of producing video images from a video signal. For example, the display device 122 may be a computer monitor, digital television display, a standard television display, a flat panel display, a projection device, or any other display device.

The speaker device 124 may be any device capable of producing sound from an audio signal. The speaker device 124 may be integrally positioned with respect to the display device 122, or may be moveable with respect to the display device 122.

The input device 126 is communicatively coupled to the tuning system 102 so that when a viewer uses the input device 126 to enter the instructions, the input device 126 generates a signal that is received by the tuning system 102, the signal representing the user entered instruction. The input device 126 may be, for example, a remote wireless control (i.e., a remote control) or a hardwired control device, and may be integrated with the tuning system 102, or moveable with respect to the tuning system 102.

Figure 2:
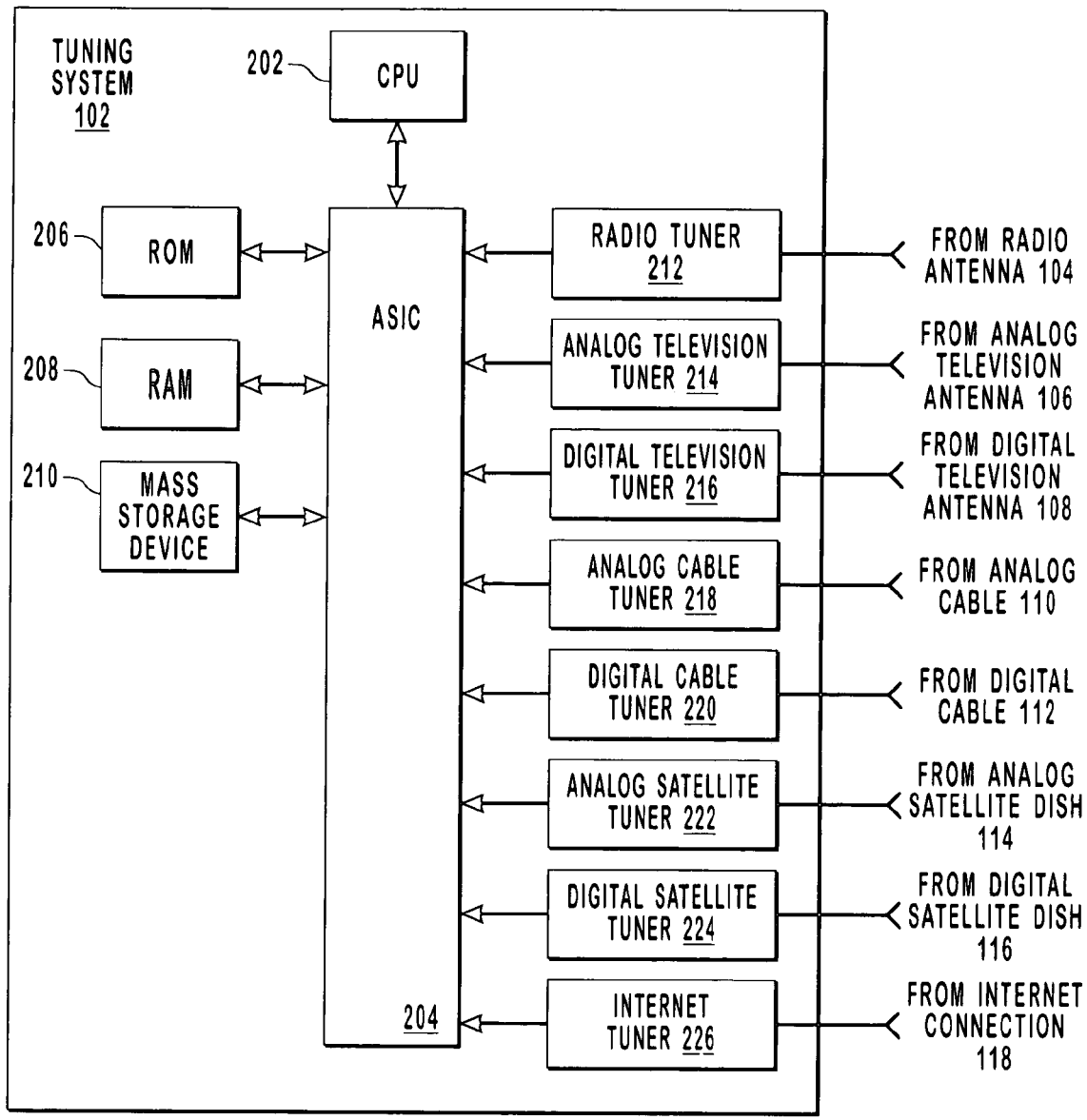
FIG. 2 schematically illustrates the internal hardware features of the tuning system of FIG. 1.

FIG. 2 is a block diagram of the internal features of the tuning system 102 of FIG. 1. The operation of the tuning system 102 is controlled by a Central Processing Unit (CPU) 202, which is coupled to an Application-Specific Integrated Circuit (ASIC) 204. The CPU 202 executes software designed to implement features of the tuning system 102 including some of the features of the present invention. The ASIC 204 contains circuitry which is used to implement certain functions of the tuning system 102. The ASIC 204 may include more than one physical component such as a demodulator, any needed decoders such as an MPEG decoder or other video decoders as appropriate to the broadcast signals received. The ASIC 204 may also include a graphics processor for performing specialized graphics functions on received video as needed. The details of the ASIC 204 are not important to the implementation of the present invention as long as the tuning system 102 is able to tune to a selected channel using service records.

Instructions, data, and other software necessary for the herein described operation of the CPU 202 and ASIC 204 may be stored, for example, in a read-only memory (ROM) 206, a random-access memory (RAM) 208, and/or a mass storage device 210. Mass storage device 210 may be any mass memory means capable of storing large amounts of data such as a magnetic or optical disk drive. The ROM 206, the RAM 208 and the mass storage device 210 are communicatively coupled to the ASIC 204 so as to be readable by the ASIC 204 and so that data may be written from the ASIC 204 to the RAM 208 and possibly to the mass storage device 210.

The tuning system 102 also includes a number of tuners which are designed to tune to particular broadcast types. Table 1 lists the tuners in the left column, the receiving device that the tuner is attached to in the middle column, and the function of the tuner in the right column.

TABLE 1

| Tuner Name | Attached Receiving Device | Tuning Function |
| --- | --- | --- |
| Radio Tuner 212 | Radio Antenna 104 | Radio (e.g., AM, FM, CB) |
| Analog Television Tuner 214 | Analog Television Antenna 106 | Analog Television (e.g., VHF, UHF) |
| Digital Television Tuner 216 | Digital Television Antenna 108 | Digital Television (e.g., ATSC, NTSC, DVB) |
| Analog Cable Tuner 218 | Analog Cable 110 | Analog Tuning (e.g., television, radio) |
| Digital Cable Tuner 220 | Digital Cable 112 | Digital Tuning (e.g., television, radio) |
| Analog Satellite Tuner 222 | Analog Satellite Dish 114 | Analog Tuning (e.g., radio and television) |
| Digital Satellite Tuner 224 | Digital Satellite Dish 116 | Digital Tuning (e.g., radio and television) |
| Internet Tuner 226 | Internet Connection 118 | Internet Tuning (e.g., POTS, cable, satellite, ISDN, T-1, T-2, T-3) |

The tuning system 102 of FIGS. 1 and 2 can have access to a variety of different broadcast types including radio terrestrial airwave (i.e., traditional radio), analog television terrestrial airwave (i.e., traditional television), analog cable (e.g., traditional cable television), digital cable, analog satellite, digital satellite, and Internet broadcasts. However, a suitable tuning system for use with the present invention may also tune to just a subset of these broadcast types.

In a typical tuning system that receives more than one broadcast type, the user must first specify the broadcast type by selecting a tuner before selecting a channel. This tuner selection can take some time. If the user is constantly switching between tuners, the tuner selections can be burdensome and annoying. Furthermore, the user may often not have full knowledge of what channels are available on a particular broadcast type. Thus, the user may select a particular tuner only to find that the user is not interested in any of the channels within that broadcast type. The present invention significantly reduces these difficulties by eliminating the need to select a tuner and by categorizing channels according to any manner desired by the user, not just by tuner or broadcast type.

Specifically, embodiments within the scope of the present invention include a means or step for storing a plurality of service records. In this description and in the claims, a "service record" is defined as a compilation of information needed to tune to a channel. This channel may be a television, radio, or data channel. In additional, a Web page is also included within the definition of a channel in which case "tuning to" the Web page would involve downloading the Web page over a network such as the Internet. A "tuner" for tuning to a Web page would be a network connector such as a modem, a network card, or any other device capable of receiving Web pages over a network.

While, the information in the service record includes tuning information, the service record may also optionally including other information such as the name and number of the corresponding channel. In the embodiment of FIGS. 1 and 2, the tuning system 102 stores service records in ROM 206, RAM 208, or mass storage device 210. However, one skilled in the art will recognize that any memory having sufficient capacity can also store the service records.

Figure 3:
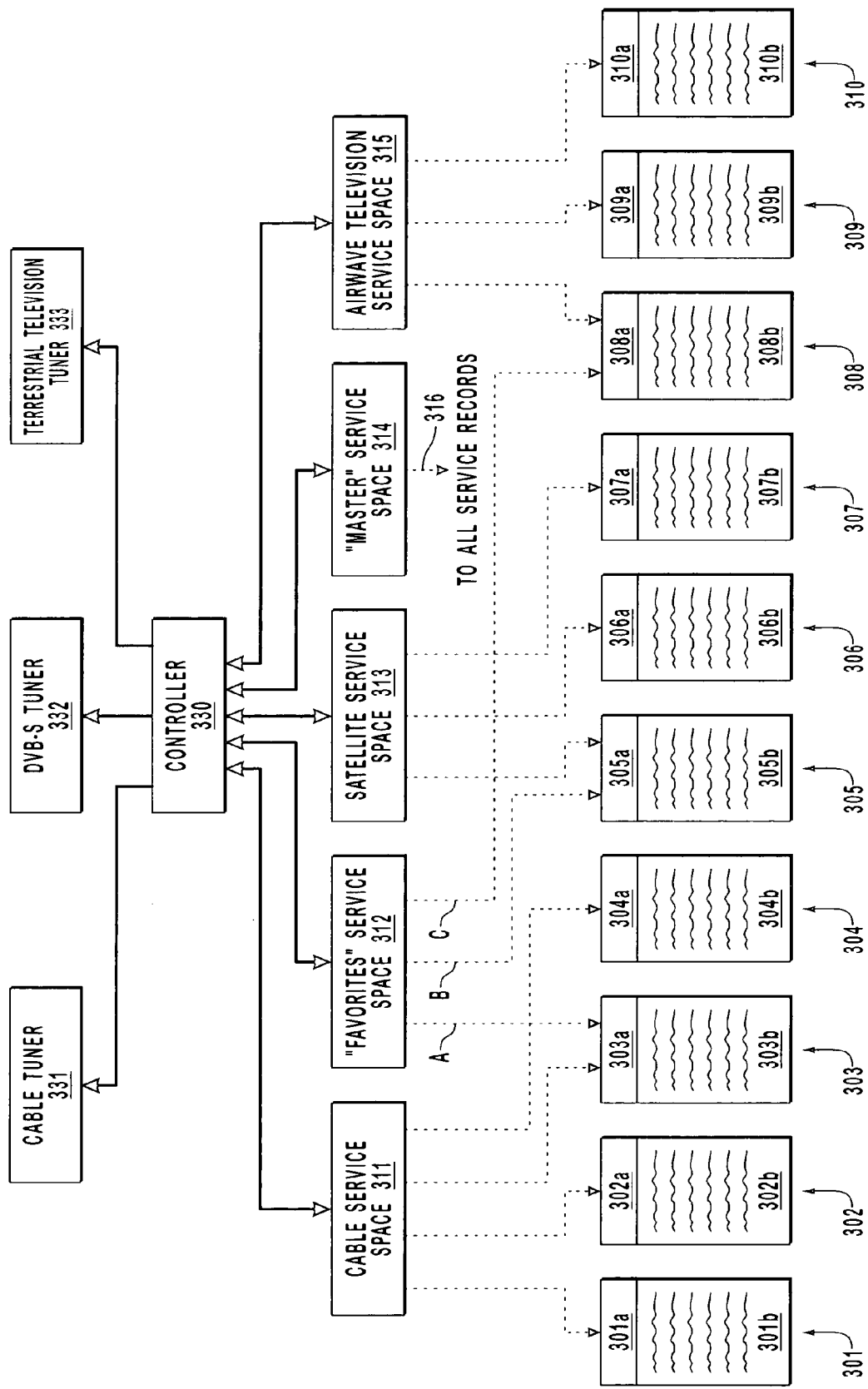
FIG. 3 illustrates a controller attached to service records through service spaces in accordance with the present invention.

FIG. 3 illustrates several service records 301–310. For clarity, assume that the tuning system 102 has access to three different broadcast types and associated tuners including analog cable, DVB-S satellite television, and terrestrial airwave television. Each service record 301–310 includes an associated identifier 301a–310a that is used by the tuning system 102 to identify the service, and includes other tuning information 301b–310b, respectively. Some of the service records (namely, service records 301–304) are for tuning to channels of analog cable television. Service records 305–307 are for tuning to channels of digital satellite television. The remaining service records 308–310 are for tuning to traditional terrestrial airwave television.

Service records 301–304 and 308–310 are for tuning to analog channels. In order to tune to a channel of an analog broadcast types such as analog cable television or traditional terrestrial airwave television, all that is needed is an identification of the broadcast type (i.e., a tuner identification) and an identification of the channel. This channel identification could be in the form of a channel number (Channel 2, 3, 4, 5, and so forth), in the form of a frequency, in the form of call letters, or any other form that identifies the channel.

Service records 305–307 are for tuning to digital channels. In order to tune to a channel of a digital broadcast type such as digital satellite television, the service records 305–307 include an identification of the broadcast type or tuner. The service records 305–307 may also include a channel identification such as a channel number. This is the minimum information needed to tune to the digital channel. The tuner can extract any other tuning information from the digital broadcast itself.

Unfortunately, the extraction of this tuning information from the digital broadcast can take significant time. Specifically, in MPEG-2, the program number and program identifier (i.e., PID) are found in the Program Association Table (PAT) portion of the video stream. Furthermore, the bit stream type (e.g., audio, video, control, and so forth) and location are found in the Program Map Table (PMT) portion of the video stream. Thus, the tuner must monitor the video stream first to obtain the information before a tune can occur. If the user changes channels frequently, the user may be inconvenienced by the constant delay between channel changes. This is why channel changes in conventional digital television devices are rather sluggish, especially when channel changes occur frequently.

In accordance with the present invention, the tuning system 102 does not always need to monitor the digital broadcast to extract tuning information. Instead, the service records 305–307 may also include the tuning information that is normally extracted from the digital broadcast itself. In this case, the digital tuning occurs faster and channel surfing is less sluggish than in conventional digital tuning systems.

A service record for a Web page might include, for example, the Uniform Resource Identifier for the Web page or any other information needed to access the Web page. While the present invention may be used to access Web pages, the remainder of this description will focus primarily on a tuning system in which broadcast channels are tuned to and accessed.

Embodiments within the scope of the present invention also includes a means or step for categorizing these service records 301–310 into service spaces. In this description and in the claims, a "service space" is defined as a collection of service records. In the embodiment of FIG. 3, service spaces 311–315 are composed of pointers to all the service records included in the service space.

The service spaces may have any desired characterization. For example, the service spaces may be characterized according to tuner or broadcast type. For example, service space 311 includes all cable television service records 301–304, service space 313 includes all satellite television service records 305–307, and service space 315 includes all airwave television service records 308–310. The service spaces may also be characterized according to desirability such as in service space 312 which includes the viewers favorite service records 303, 305 and 308. There is also a "master" service space which includes all service records 301–310 as does the "master" service space 314. The service spaces may also be characterized according to content such as sports, cartoons, news, movies, children, educational, or by any other category desired by the viewer.

The dotted arrowed lines in FIG. 3 represent that the service space originating the arrowed line includes a pointer for the service record indicated by the arrowed line. For example the "favorites" service space 312 includes pointers A, B, and C for pointing to service records 303, 305 and 308, respectively. The other service spaces 311–313 and 315 contain similar pointers for pointing to their respective service records. For clarity, the individual pointers for the "master" service space 314 is not shown. However, arrow line 316 represents all of the pointers of the "master" service space 314.

Note that each service records may be shared with several service spaces. For example, service record 303 is shared by the cable television service space 311, the "favorites" service space 312, and the "master" service space 314. Thus, memory is conserved since each service space only contains a pointer for the service record, rather than the entire service record.

As each service record is created (using the means for accumulating service records described below), the tuning system 102 may include that service record in the "master" service space. A graphical user interface may be displayed on the display device 122 in response to a viewer-entered input at the input device 126. Using this input device 126 and the graphical user interface, the viewer may create new service spaces, deleted old service spaces, add a service record to a service space, delete a service record from a service space, and so forth. Thus, the viewer can customize service spaces as desired.

Service spaces may also temporarily point to a service record. For example, in the case of pay per view, a service space may include a pointer to a service record that describes a pay-per-view program. If the viewer selects this program, the service space is automatically altered to include a pointer to the pay-per-view program.

A user can select one of the service records (i.e., pointers) within one of the service spaces using a means or step for receiving a selection of one of the service records in one of the service spaces as is now described. A controller 330 controls which service spaces are active, and controls the channel changing process within that active service space.

Figure 4:
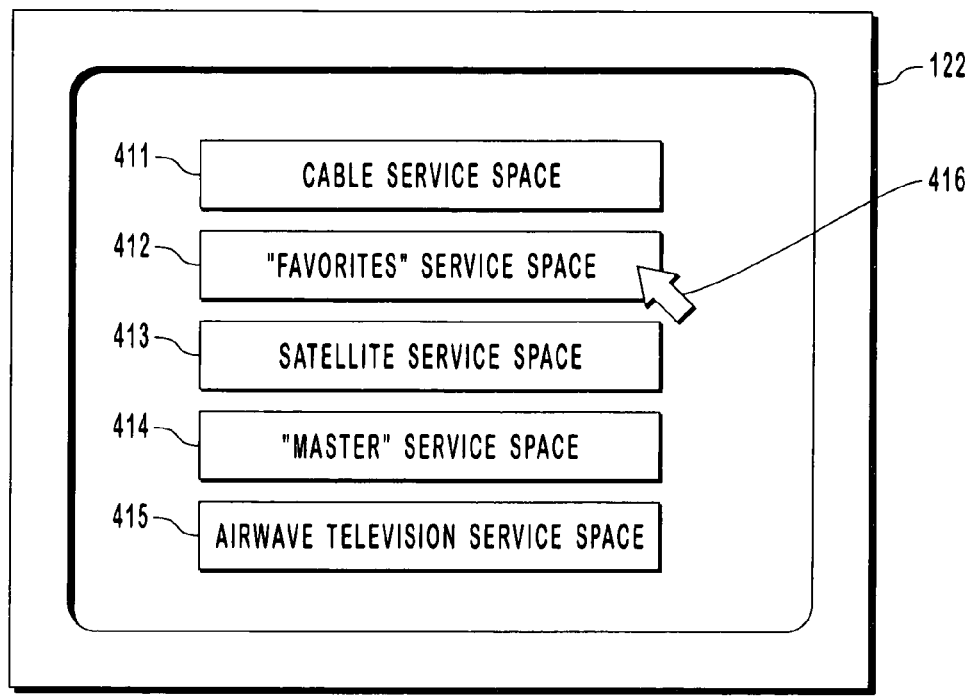
FIG. 4 illustrates the display device of FIG. 1 displaying a graphical user interface in which a viewer may select one of the service spaces of FIG. 3 in which to channel surf.

Specifically, a graphical user interface as shown in FIG. 4 may be displayed on the display device 122. Each of the titles of the service spaces 311–315 is displayed such as cable service space title 411, "favorites" service space title 412, satellite service space title 413, "master" service space title 414, and airwave television service space title 415, respectively. As an alternative to initially displaying the service space titles 411–415, the "master" service space 314, or another service space 311–313 or 315 may be selected as the default service space thereby eliminating the need to select a service space when channel surfing is desired within the default service space. In this case, the other service spaces may be selected by inputting a predetermined input signal from the input device 126. Returning to the embodiment of FIG. 4, a viewer may select a service space (e.g., "favorites" service space 312) by activating the selecting the appropriate service space title (e.g., the "favorites" service space title 412) using the input device 126. The selection of the "favorites" service space 312 is indicated by the position of the arrow 416 on the graphical user interface.

Figure 5:
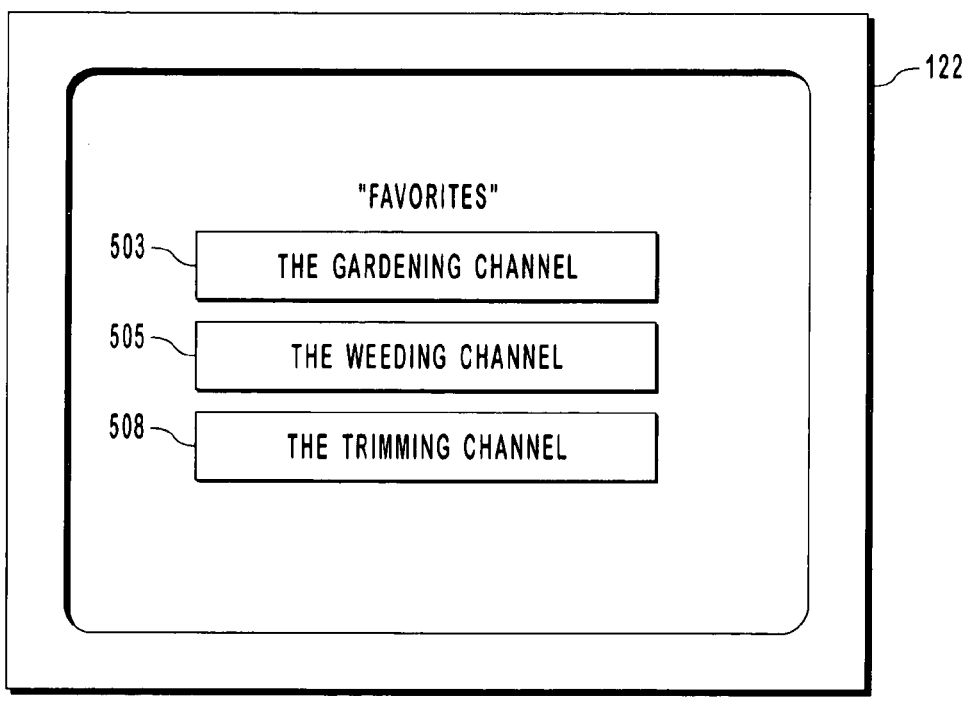
FIG. 5 illustrates the display device of FIG. 1 displaying a graphical user interface in which a viewer may select one of the channels within the service space selected in FIG. 4.

FIG. 5 shows a graphical user interface displayed on the display device 122 in response to a selection of the "favorites" service space 312 of FIG. 4. In response the selection, the pointers of all of the service records in the "favorites" service space 312 are used to obtain a description of the channel corresponding to the service records within the service space 312 including service records 303, 305 and 308. The resulting description is then displayed on the display device 122. In the example shown in FIG. 5, the favorite service records 303, 305 and 308 correspond to a description 503 of the gardening channel, a description 505 of the weeding channel, and a description 508 of the trimming channel, respectively.

Specifically, the pointer A of the "favorites" service space is used to obtain a description 503 contained in the service record 303. Pointers B and C are used to obtain descriptions 505 and 508 of service records 305 and 308, respectively. The descriptions A, B, C, might include the channel number, call letters, frequency, or any other identifying information recording the channel corresponding to the service space. In the example of FIG. 5, the descriptions 503, 505 and 508 represent a channel title.

The viewer may now use the input device 126 to select the desired channel. For example, assume the viewer indicates the "gardening channel" description 503. The controller 330 then determines that the viewer has selected the channel corresponding to the service record 303. The controller then tunes to the corresponding channel using a means or step for tuning to a channel corresponding to the selected service record using the tuning information provided in the service record. This means for tuning is described further below.

In another example of a means or step for receiving a selection of one of the service records in one of the service spaces, after the service space is selected as in FIG. 4 and the accompanying description, the input device 126 is used to channel up or down through the service records in the selected service space without the aid of a graphical user interface such as that shown in FIG. 5. For example, if the "favorites" service space 314 is selected either actively or by default, the tuning system 102 may initially automatically tune to a default channel such as the channel corresponding to the pointer A (i.e., service record 303) using the means for tuning. Should the select the next channel, the pointer B is used to tune to the channel corresponding to the service record 305 using the means for tuning. Another selection of the next channel might cause pointer C to be used to tune to the channel corresponding to the service record 308 using the means for tuning. Another might cause the tuning to wrap forward to pointer A for tuning to the service record 303 using the means for tuning.

Starting at the default pointer A, should the viewer select the previous channel, the tuning may wrap back to pointer C for tuning to the channel corresponding to the service record 308 using the means for tuning. Another previous channel selection might cause pointer B to be used to tune to the channel corresponding to service record 305 using the means for tuning.

From having read this disclosure, one skilled in the art will recognize that there are many other ways to assist a viewer in selecting the desired channel within the desired service space.

Once the selection of the desired service records is received, the controller 330 tunes to the selected service records using a means or step for tuning to a channel corresponding to the selected service record using the tuning information provided in the service record. Specifically, the controller 330 uses the information within the selected service record to select the appropriate tuner and to tune to the corresponding channel.

For example, service records 301–304 include an indication that the channels are tunable through the cable tuner 331, service records 305–307 include an indication that the channels are tunable through the DVB-S tuner 332, and service records 308–310 include an indication that the channels are tunable through the terrestrial television tuner 333. Once the correct tuner is selected, the other tuning information within the selected service record is used to tune to the desired channel. This other tuning information will differ depending on the tuner type and has been described above with respect to the means or step for storing a plurality of service records and FIG. 3.

Note that the "favorites" service space 312 contains service records of a variety of different broadcast types including analog cable, digital satellite and analog terrestrial airwave. Also, tuning to the channels within the "favorites" service space requires the use of several tuners such as cable tuner 331, DVB-S tuner 332, and terrestrial television tuner 333 (see FIG. 3). Conventionally, to change channels between broadcast types, a viewer would have to select the broadcast type as well as the channel within the broadcast type. However, as described above with the present invention, the viewer may change channels within a service space but between broadcast types by issuing a simple channel change instruction. The viewer need not be concerned with the particular broadcast type which delivers the desired channel. Thus, the present invention simplifies the tuning experience for the viewer for tuning systems that receive multiple broadcast types.

Up to this point, this description has assumed the existence of the service records 301–310. In order to obtain these service records 301–310, embodiments within the scope of the present invention include means or step for accumulating the plurality of service records 301–310. An example of a method for accumulating the plurality of service records is shown in FIG. 6.

The service records 301–310 may be initially accumulated by each tuner 331–333 monitoring the digital data stream or analog broadcast (step 610) to determine which channels are available (step 620). A channel may be determined to be available (step 620) when the channel is tuned and a clear signal is received. Once a channel is determined to be available (step 620), the tuning system 102 determines whether a service record already exists for that channel (decision block 630). If a service record already exists (yes in decision block 630), the method returns to step 620 where the next available channel is determined. If a service record doesn't exist (no in decision block 630), a service record is created for that channel (step 640), and the parameters used by the tuner to tune to that channel are included in the service record (step 650). Then the method repeats for all available channels for a given tuner, and for all tuners within the tuning system 102.

The tuning system 102 may repeat this method at predetermined intervals to detect new available channels for each tuner. The method may be performed during low usage times so as not to interfere with the viewer's normal viewing of the display device 122. In addition, at the start of the predetermined interval when the tuning system 102 is to perform the service record check, the tuning system 102 may optionally check to see if the tuning system 102 is already in use. If not in use, the tuning system 102 will perform the method of FIG. 6 or another equivalent service record accumulation method. In addition, service record accumulation may be terminated when the tuning system 102 detects that the viewer is trying to use the tuning system 102. Thus, inconvenience to the viewer may be minimized.

Figure 6:
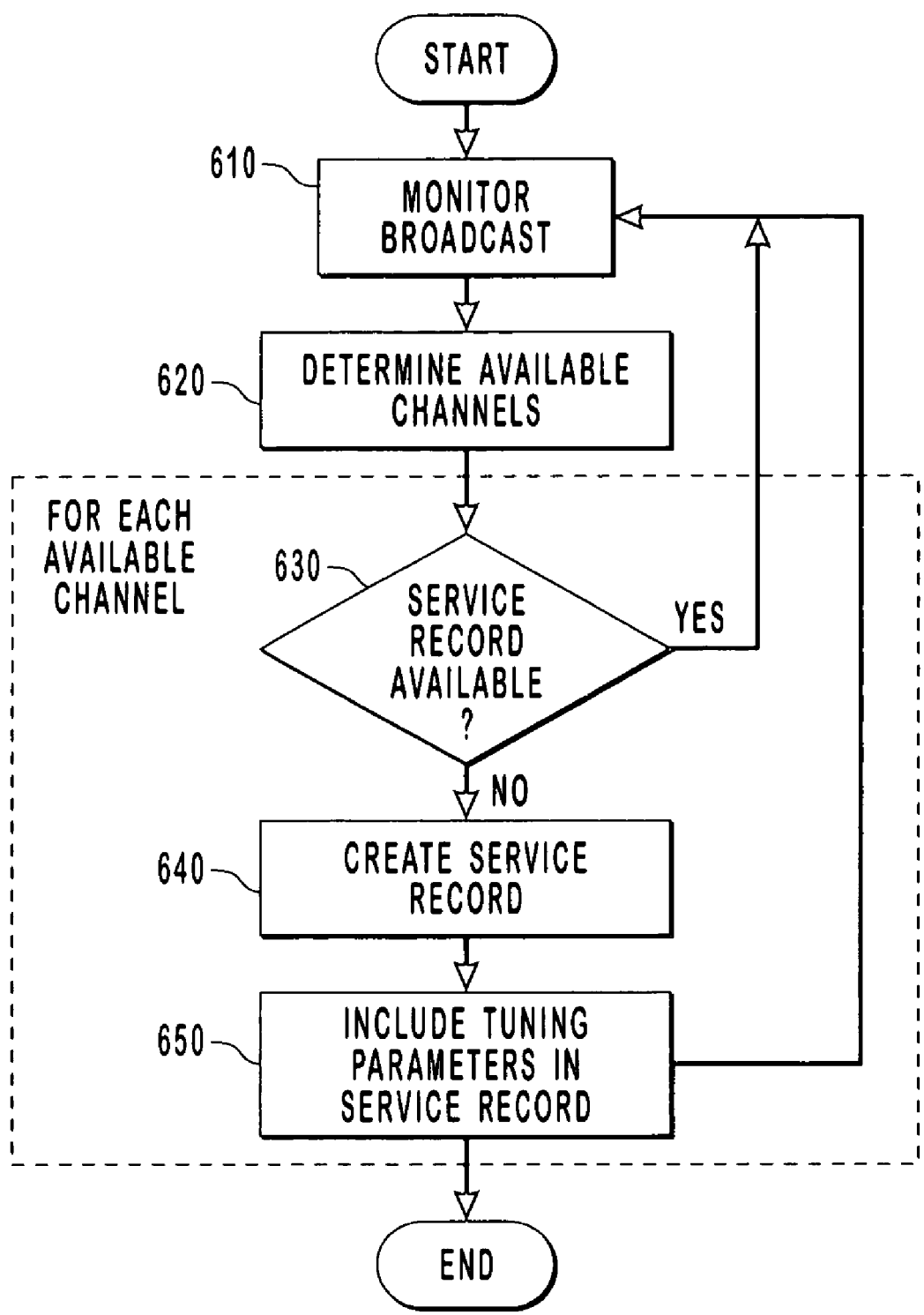
FIG. 6 illustrates a flowchart of a method for accumulating the service records of FIG. 3.
Figure 9:
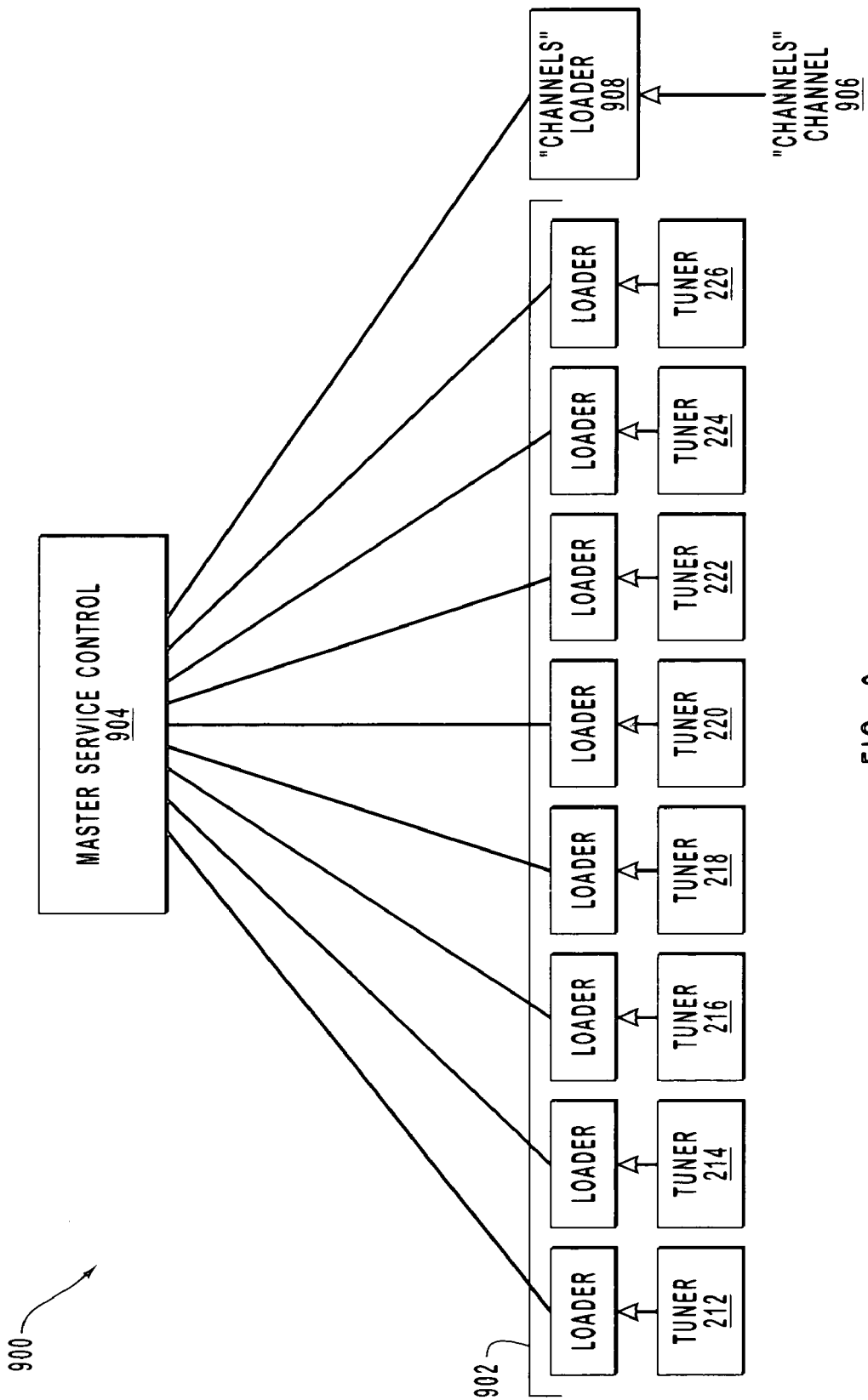
FIG. 9 schematically illustrates a structure used to accumulate service records according to the method of FIG. 6.

FIG. 9 schematically shows a structure 900 for accumulating service records according to the method of FIG. 6. Each structure 900 includes a master service graph (MSG) loader 902 for each broadcast type and for each tuner. The master service graph loader is responsible for monitoring the broadcast for information representing the tuned channel. Once a new channel is detected, the tuning information is provided to a master service control 904 which creates a service record and includes the tuning information in the service record. Additionally, the master service control 904 will include the new service record in the master service space by adding a pointer to the master service space that points to the new service record.

FIG. 9 shows that each tuner type includes a corresponding loader for populating the master service graph. Thus, as the tuner receives channel tuning information for a new channel, the corresponding loader (or the master service control) creates the new service record. In some cases, there may be channels that include aggregated system information regarding a variety of different channels. For example, a clearinghouse entity may scan available channels in a given region, compile the tuning information for those channels, and transmit that aggregated tuning information over a single channel 906 to the tuning system. In this case, the associated loader 908 would frequently receive tuning information over the channel 906 related to a variety of different channels and would monitor for new channels referenced in the aggregated systems information. This may be especially feasible in broadcast specification such as High Definition Television (HDTV) in which case the channel identification and system information is included within the channel.

In addition to providing a simple method for tuning to channels of a variety of different broadcast types, the tuning system 102 performs fast tunes to digital channels. Conventional digital television tuners take significant time tuning to a digital channel since digital tuning is typically a multi-step operation. Once a tune request is received, the tuner monitors the digital video stream to extract all necessary information needed to tune such as the program number or the program identifier. This information is not always immediately available in the video stream. Thus, the tuner must monitor the digital video stream for some time before extraction can begin. Once the information is extracted, the tuner uses this information to perform the actual tune operation.

Figure 7:
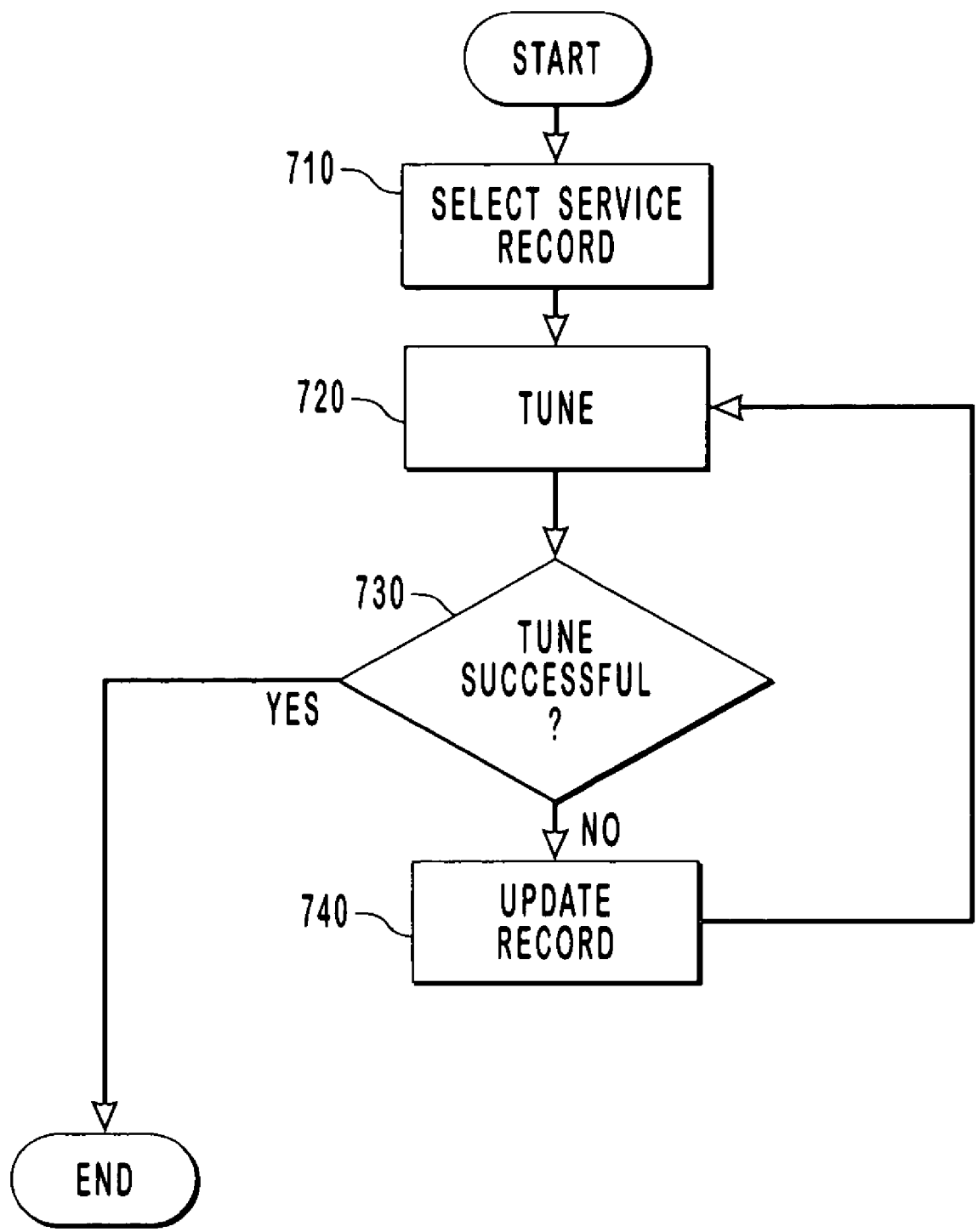
FIG. 7 illustrates a flowchart for rapidly tuning to a digital channel.

In contrast, the tuning system 102 often performs a fast tune to the digital channel by sometimes eliminating the need to extract tuning information from the digital video stream. The fast tuning method is described with respect to the flowchart of FIG. 7. First, the user selects a service record (step 710). Then, the controller 330 uses the information in the service record to perform the tune (step 720). Thus, instead of the time consuming process of extracting the tuning information from the digital video stream, the controller 330 reads the information from the corresponding service record. In this case, the tune would be successful (YES in decision block 730) and the method would end.

However, the information within the service record may be incorrect or outdated. In this case, the tune would be unsuccessful (NO in decision block 730). The controller 330 would then update the record (step 740) and attempt to once again tune to the channel using the updated information (step 720).

Figure 8:
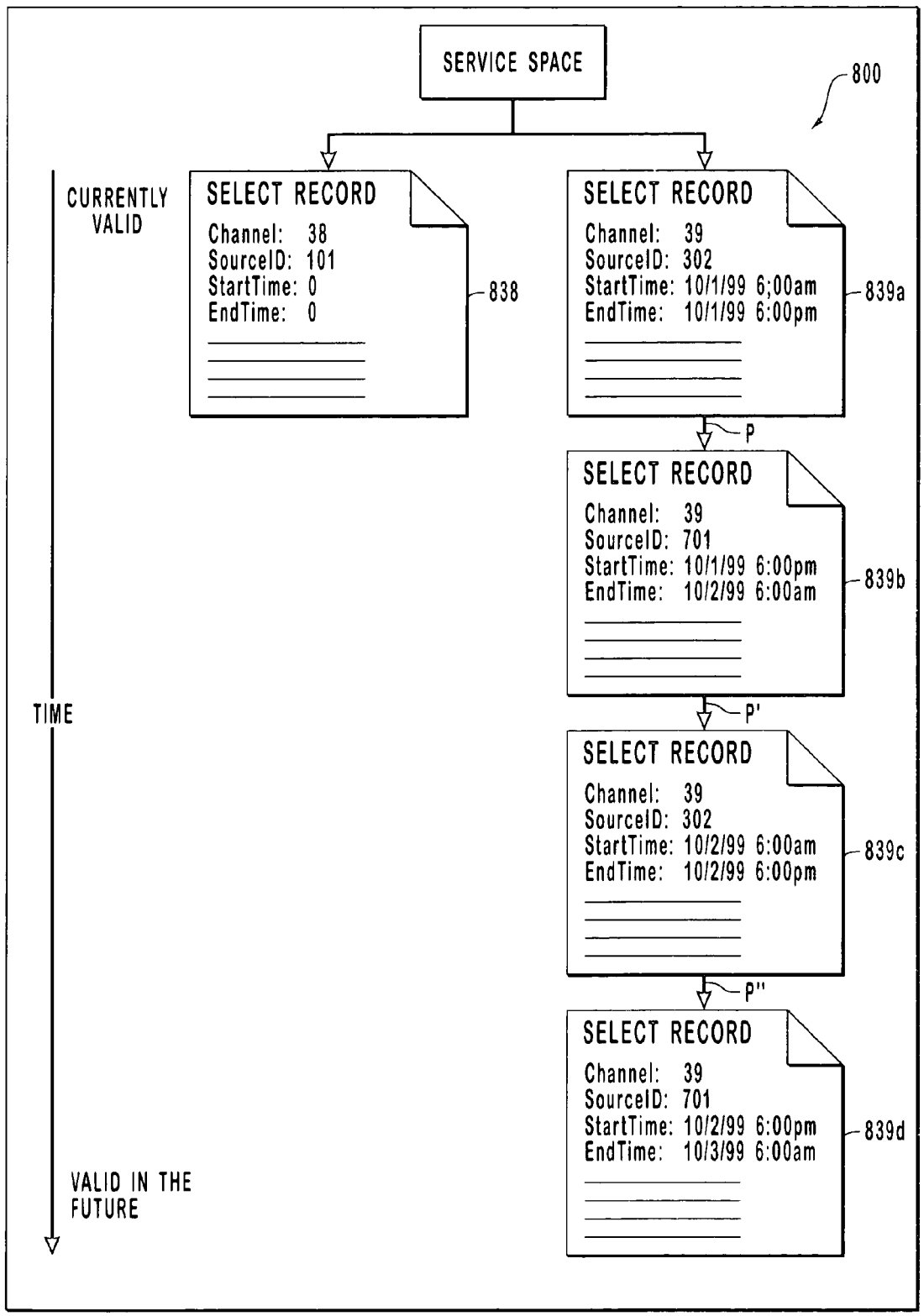
FIG. 8 illustrates a data structure having multiple time-dependent service records.

Although each service record may be valid permanently, there will often be times when the desired service record will depend on the time. This is the case, for example, where an electronic program guide accessible by the tuning system 102 indicates that beginning at 2:00 am on Mar. 1, 2000, a given channel's broadcast source will change from broadcaster XYZ to broadcaster WXY. Also, this may occur when a channel is shared by different broadcasters with one broadcaster broadcasting during the day, and another at night. FIG. 8 illustrates a structure 800 that enables this time-dependent tuning.

A service space may have service records that are organized according to channel. For example, service record 838 corresponds to a channel 38. If channel 38 is selected, the information within the service record 838 is used to perform the tune. A service record 839*a* correspond to channel 39. However, service record 839*a* includes time limitations and a pointer P to another service record 839*b*. If the current time does not meet the time conditions, then the pointer P is used to obtain the next service record 839*b*. If the time conditions of service record 839*b* are not satisfied, the pointer P' is used to access service record 839*c* and so forth until a service record 839*d* is found that does correspond to the current time. Then, that service record 839*d* is used to tune to the appropriate program.

The present invention may also be used to implement "Near Video-On-Demand" (NVOD). "Video-On-Demand" is a technology that allows a user to select a program such as a movie for viewing and then almost immediately begin viewing the program. Video-On-Demand thus requires that each possible program selection be configured to be immediately available once selected. "Near Video-On-Demand" is also a technology that also allows a user to select a program for viewing. However, the user may typically have to wait a little while before the selected program is available. While there is some inconvenience in having to wait for the program versus having the program immediately available, Near Video-On-Demand does have the restraint that each possible program selection be configured to be immediately available. Near Video-On-Demand thus allows more flexibility in accessing a source for the selected program. In the example that follows, the source for the selected program is one or more broadcast signals.

Figure 10:
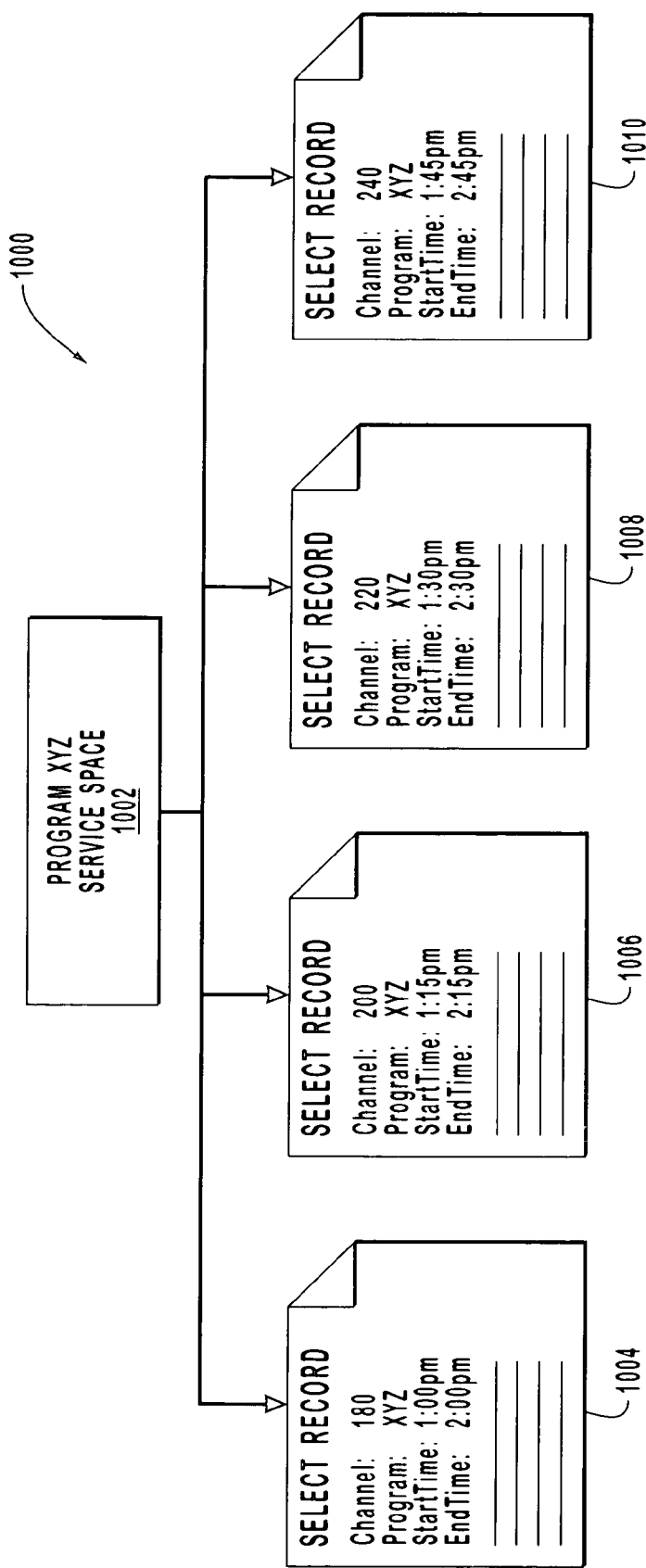
FIG. 10 schematically illustrates a data structure for implementing "Near Video On Demand" or NVOD using the principles of the present invention.

The implementation of Near Video-On-Demand using the principles of the present invention will be illustrated with reference to FIG. 10. The data structure 1000 is created in response to a request to access (e.g., view or record) a certain program called "PROGRAM XYZ" in the example of FIG. 10. PROGRAM XYZ may represent a movie, a talk show, a situation comedy episode, or any other desired broadcast segment.

In response to a request for PROGRAM XYZ, a service space is created for PROGRAM XYZ such as PROGRAM XYZ service space 1002 if such a service space does not already exist. Next, a search is performed to find all channels that are going to show PROGRAM XYZ in a time period close to the current time if PROGRAM XYZ is to be viewed as soon as possible, or in a time period close to some future time if PROGRAM XYZ is to be viewed at some future time. In the example, the time of the request is assumed to be 1:10 pm for illustrative purposes and it is also assumed that PROGRAM XYZ is to be viewed as soon as possible. The search may evaluate any source of programming information that may divulge what programs are being shown on what channels and at what time. Such a source may include, for example, an Electronic Program Guide. In the example of FIG. 10, four channels are found that will show PROGRAM XYZ at a time close to the current time. A service record is created for each channel showing PROGRAM XYZ.

The first service record 1004 indicates that PROGRAM XYZ begins at 1:00 pm on channel 180. The second service record 1006 indicates that PROGRAM XYZ will begin at 1:15 pm on channel 200. The third service record 1008 indicates that PROGRAM XYZ will begin at 1:30 pm on channel 220. The fourth service record 1010 indicates that PROGRAM XYZ will begin at 1:45 pm on channel 240. A pointer to each of these service records is included in the PROGRAM XYZ service space 1002 thus creating the data structure 1000.

The data structure 1000 is then used to select the appropriate service record to be used to tune. Since the current time is 1:10 pm, a logical choice of service records would be service record 1006 since it requires the least waiting time for PROGRAM XYZ without missing any of PROGRAM XYZ. The tuning information for the selected service record 1006 is then used to tune to the appropriate channel which is, in this case, channel 200. The viewer would then wait for five minutes for PROGRAM XYZ to being. The program would begin at 1:15 pm and then would typically be viewed until the end time of the program which is 2:15 pm being apparently a one-hour program.

The use of service records and service spaces according to the principles of the present invention allows a great deal of flexibility in optimizing the viewing experience. For example, suppose that in the example of FIG. 10, that five minutes after the viewer begins viewing PROGRAM XYZ on channel 200, the viewer is distracted by other matters such as a 25 minute telephone call received at 1:20 pm. The user may then activate a pause function in the tuning system. At 1:45 pm, 25 minutes later, the viewer returns to the tuning system to continue viewing. When the viewer activates a resume function to continue viewing, the tuning system intelligently determines the appropriate channel to return to, even if that channel was not the one viewed at the time of the pause. In this case, the tuning system assumes, or the viewer has indicated, that none of PROGRAM XYZ is to be missed. The tuning system then determines what channel to tune to accomplish this objective. Service record 1010 indicates that PROGRAM XYZ begins at the time the resume function is activated at 1:45 pm. Thus, the tuning system uses service record 1010 to tune to channel 240 to resume viewing the program.

If the viewer is not to see the first five minutes of PROGRAM XYZ again, the tuning system may determine the point in PROGRAM XYZ where the viewer activated the pause function. In this case, that point is five minutes after the beginning of PROGRAM XYZ. The tuning system would thus tune to channel 240 at 1:50 pm to resume PROGRAM XYZ at precisely the point where the viewer paused PROGRAM XYZ. The viewer need never know that the program was resumed on a different channel. From the viewer's perspective, PROGRAM XYZ was provided automatically with some wait time between the request to view and the beginning of the program, and with some wait time after the resume function was activated until the program was resumed.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. In a tuning system for tuning to channels of a plurality of different broadcast types including digital broadcasts, a method of efficiently tuning to a channel of one of the broadcast types, the method comprising the following:

an act of the tuning system storing a plurality of service records in a plurality of service spaces of a memory accessible by the tuning system, wherein each service record contains tuning information including a channel identifier for tuning to a channel of one of the plurality of broadcast types;

an act of extracting additional tuning information from one or more digital data streams that are broadcast to the tuning system over one or more digital channels, wherein the additional tuning information is necessary for subsequent tuning to the one or more corresponding digital channels;

an act of storing the additional tuning information in one or more of the service records that correspond to one or more digital channels over which the digital data streams were broadcast;

an act of the tuning system categorizing the plurality of service records into a plurality of service spaces;

upon receiving a user selection of a service space, identifying a correct one of a plurality of tuners to use in tuning to one or more channels that are identified by one or more service records in the selected service space;

an act of the tuning system receiving a selection from the user of a particular channel, the particular user-selected channel corresponding to a particular one of the service records in the selected service space;

an act of the tuning system accessing the particular one of the service records from the memory, the particular one of the service records including the extracted additional tuning information; and when the extracted additional tuning information is correct for the user-selected channel, an act of the tuning system tuning to the user-selected channel using the tuning information and the extracted additional tuning information, which is retrieved from the one or more service records rather than being re-extracted from the one or more digital data streams, and wherein the extracted additional tuning information would otherwise be required to be re-extracted from the one or more digital data streams to tune into the selected channel; and when the extracted additional tuning information is incorrect or outdated, an act of the tuning system unsuccessfully attempting to tune to the particular channel selected by the user using the tuning information and the extracted additional tuning information, the tuning being unsuccessful due, at least in part, to the additional tuning information being incorrect or outdated, and in response to determining that the attempt to tune to the particular channel selected by the user was unsuccessful, updating the service record with updated information and thereafter using the updated information from the service record to successfully tune to the particular channel selected by the user.

2. The method according to claim 1, wherein the act of the tuning system storing comprises the following:

an act of the tuning system storing information that identifies a tuner in each of the plurality of service records in the memory; and an act of the tuning system storing information that identifies a channel in each of the plurality of service records in the memory.

3. The method according to claim 1, wherein the act of the tuning system storing comprises the following:

an act of the tuning system accumulating the plurality of service records in the memory.

4. The method according to claim 3, wherein the act of the tuning system accumulating the plurality of service records comprises the following:

an act of at least one tuner of the tuning system monitoring at least one broadcast type to determine available channels in the at least one broadcast type.

5. The method according to claim 1, wherein the act of the tuning system categorizing the plurality of service records into a plurality of service spaces comprises the following:

for each of the plurality of service records, an act of the tuning system storing a pointer associated with the service record in at least one of the service spaces.

6. The method according to claim 1, wherein the act of the tuning system categorizing the plurality of service records into a plurality of service spaces further comprises the following:

an act of the tuning system creating a favorites service space for including pointers to service records that correspond to service records included in at least one other service space corresponding to a particular broadcast type, and such that a viewer can select the channel from the favorites service space.

7. A computer program product for use in a tuning system for tuning to channels of a plurality of different broadcast types including digital broadcasts, the computer program product comprising computer-readable media having computer-executable instructions for implementing the method recited in claim 1.

8. A computer program product as recited in claim 7, wherein the act of the tuning system storing comprises the following:
- an act of the tuning system storing information that identifies a tuner in each of the plurality of service records in the memory; and
- an act of the tuning system storing information that identifies a channel in each of the plurality of service records in the memory.

9. A computer program product as recited in claim 7, wherein the act of the tuning system storing comprises the following:
- an act of the tuning system accumulating the plurality of service records in the memory.

10. A computer program product as recited in claim 9, wherein the act of the tuning system accumulating the plurality of service records comprises the following:
- an act of at least one tuner of the tuning system monitoring at least one broadcast type to determine available channels in the at least one broadcast type.

11. A computer program product as recited in claim 7, wherein the act of the tuning system categorizing the plurality of service records into a plurality of service spaces comprises the following:
- for each of the plurality of service records, an act of the tuning system storing a pointer associated with the service record in at least one of the service spaces.

12. A computer program product as recited in claim 7, wherein the act of the tuning system categorizing the plurality of service records into a plurality of service spaces further comprises the following:
- an act of the tuning system creating a favorites service space for including pointers to service records that correspond to service records included in at least one other service space corresponding to a particular broadcast type, and such that a viewer can select the channel from the favorites service space.

13. A computer program product as recited in claim 7, wherein the additional tuning information includes information obtained from the program association table portion of the one or more digital data streams.

14. A computer program product as recited in claim 7, wherein the user selection of the service space is made from a graphical user interface.

15. A computer program product as recited in claim 7, wherein the channel selection is made from a graphical user interface.

16. A computer program product as recited in claim 7, wherein the additional tuning information includes at least one of a program number, program identifier, and a bit stream type.

17. A method as recited in claim 1, wherein the user selection of the service space is made from a graphical user interface.

18. A method as recited in claim 1, wherein the channel selection is made from a graphical user interface.

19. A method as recited in claim 1, wherein the additional tuning information includes at least one of a program number, program identifier, and a bit stream type.

20. A method as recited in claim 1, wherein at least one service record includes a time condition, which causes the service record to point to another service record when the time condition is unsatisfied.

21. A method as recited in claim 1, further including an act of receiving input for pausing a program and subsequent to receiving additional input for resuming display of the programming, determining an appropriate channel to return to, and wherein the appropriate channel to return to is a different channel than the selected channel and that started at a different time than the selected channel.

22. A method as recited in claim 1, wherein the method further includes receiving aggregate information corresponding to a plurality of different channels over a single channel.

23. In a tuning system for tuning to channels of a plurality of different broadcast types, a method of efficiently tuning to a channel of one of the broadcast types without a user having to designate the broadcast type, the method comprising the following:
- a step for storing a plurality of service records, each service record containing tuning information for tuning to a particular channel of one of the plurality of broadcast types;
- a step for grouping the plurality of service records into a plurality of service spaces according to broadcast content type that is other than broadcast type, wherein at least one service space includes a plurality of different service records corresponding to a plurality of different broadcast types;
- displaying the service spaces to a user according to content type;
- receiving a user selection of one of the service spaces;
- upon receiving the selection of one of the service spaces, displaying information corresponding to service records of the selected service space that correspond to the same content type, wherein the corresponding service records include service records corresponding to different broadcast types;
- a step for receiving a selection of one of the service records corresponding to the selected service space; and
- a step for tuning to a channel corresponding to the selected service record using the tuning information provided in the service record.

24. The method according to claim 23, wherein the step for storing comprises the following:
- an act of storing information that identifies a tuner; and
- an act of storing information that identifies a channel tunable by the tuner.

25. The method according to claim 23, wherein the step for storing comprises the following:
- a step for accumulating the plurality of service records.

26. The method according to claim 25, wherein the step for accumulating the plurality of service records comprises the following:
- an act of a tuner monitoring a broadcast to determine available channels.

27. The method according to claim 26, wherein the step for accumulating the plurality of service records further comprises the following:
- for each of the available channels, an act of creating a service record for the available channel if a service record does not already exist for the available channel.

28. The method according to claim 27, wherein the step for accumulating the plurality of service records further comprises the following:
- an act of including information that the tuner used to tune to the available channel in the service record.

29. The method according to claim 25, wherein the step of accumulating the plurality of service records comprises:

a specific act of providing a loader for each tuner in the tuning system;

a specific act of using the loader to monitor the channels tuned to by the corresponding tuner for a new channel;

a specific act of a master service control creating a new service record corresponding to the new channel; and a specific act of including the tuning parameters used to tune to the new channel in the new service record.

30. The method according to claim 23, wherein the step for categorizing the plurality of service records into a plurality of service spaces comprises the following:

for each of the plurality of service records, an act of storing a pointer associated with the service record in at least one of the service spaces.

31. The method according to claim 23, wherein the step for categorizing the plurality of service records into a plurality of service spaces comprises the following:

an act of creating a master service space that includes pointers to all of the plurality of service records.

32. The method according to claim 23, wherein the step for categorizing the plurality of service records into a plurality of service spaces comprises the following:

an act of creating a favorites service space for including service records that correspond to desirable channels.

33. The method according to claim 23, wherein the step for tuning to a channel corresponding to the selected service record using the tuning information provided in the service record comprises the following:

an act of the tuning system tuning to a selected digital channel corresponding to the selected service record using the tuning information provided in the service record.

34. In a tuning system for tuning to channels of a plurality of different broadcast types, a computer program product for implementing a method of efficiently tuning to a channel of one of the broadcast types without having to designate the broadcast type, the computer program product comprising:

a computer readable medium for providing computer program code means utilized to implement said method; and wherein said computer program code means is comprised of executable code for implementing the method recited in claim 23.

35. The computer program product according to claim 34, wherein the executable code for implementing the step for storing further comprises executable code for implementing the following:

an act of the tuning system storing information that identifies a tuner; and an act of the tuning system storing information that identifies a channel tunable by the tuner.

36. The computer program product according to claim 35, wherein the executable code for implementing the step for accumulating the plurality of service records comprises executable code for implementing the following:

an act of a tuner monitoring a broadcast to determine available channels;

for each available channel, an act of creating a service record for the available channel if a service record does not already exist for the available channel; and for each available channel, an act of including information that the tuner used to tune to the available channel in the service record.

37. The computer program product according to claim 34, wherein the executable code for implementing the step for storing further comprises the executable code for implementing the following:

a step for accumulating the plurality of service records.

* * * * *